United States Patent
Man et al.

(10) Patent No.: US 9,318,303 B2
(45) Date of Patent: Apr. 19, 2016

(54) CHARGED PARTICLE BEAM APPARATUS

(71) Applicant: HITACHI HIGH-TECH SCIENCE CORPORATION, Minato-ku, Tokyo (JP)

(72) Inventors: Xin Man, Tokyo (JP); Tatsuya Asahata, Tokyo (JP); Atsushi Uemoto, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 14/470,183

(22) Filed: Aug. 27, 2014

(65) Prior Publication Data

US 2015/0060695 A1 Mar. 5, 2015

(30) Foreign Application Priority Data

Sep. 2, 2013 (JP) ................................. 2013-181523

(51) Int. Cl.
| | |
|---|---|
| H01J 37/305 | (2006.01) |
| G01Q 70/16 | (2010.01) |
| H01J 37/317 | (2006.01) |
| H01J 37/20 | (2006.01) |
| H01J 37/244 | (2006.01) |

(52) U.S. Cl.
CPC ............... *H01J 37/317* (2013.01); *H01J 37/20* (2013.01); *H01J 37/244* (2013.01); *H01J 2237/2067* (2013.01); *H01J 2237/20214* (2013.01); *H01J 2237/2445* (2013.01)

(58) Field of Classification Search
CPC ....................................................... H01J 37/20
USPC .................................................... 250/442.11
See application file for complete search history.

(56) References Cited

U.S. PATENT DOCUMENTS

| | | | | |
|---|---|---|---|---|
| 2005/0236587 | A1* | 10/2005 | Kodama et al. | 250/492.21 |
| 2007/0045560 | A1* | 3/2007 | Takahashi | H01J 37/304 250/442.11 |
| 2009/0138995 | A1* | 5/2009 | Kelly | H01J 49/0004 850/60 |
| 2010/0176297 | A1* | 7/2010 | Shichi | H01J 37/20 250/310 |
| 2011/0226948 | A1* | 9/2011 | Tanaka | H01J 37/222 250/307 |
| 2013/0214468 | A1* | 8/2013 | Giannuzzi | 269/287 |

FOREIGN PATENT DOCUMENTS

JP 2009294235 12/2009

\* cited by examiner

*Primary Examiner* — Robert Kim
*Assistant Examiner* — Eliza Osenbaugh-Stewar
(74) *Attorney, Agent, or Firm* — Adams & Wilks

(57) ABSTRACT

A charged particle beam apparatus includes an electron beam irradiation unit that irradiates a sample with electron beams along a first irradiation axis. A rotation stage holds the sample and has a rotation axis in a direction perpendicular to the first irradiation axis. An ion beam irradiation unit irradiates the sample with ion beams along a second irradiation axis that is substantially parallel to the rotation axis to process the sample into a needle shape. A detection unit detects at least one of charged particles and X rays generated via the sample by the irradiation with the ion beams or the electron beams, and a gaseous ion beam irradiation unit irradiates the sample with gaseous ion beams. A control unit controls the apparatus to incrementally rotate the rotation stage repeatedly by a predetermined angle to rotate the rotation stage by 360° in conjunction with irradiating the entire surface of the needle-shaped sample in a circumferential direction with the gaseous ion beams to remove ions implanted during processing the sample by the ion beams.

15 Claims, 4 Drawing Sheets

CHARGED PARTICLE BEAM APPARATUS

This application claims priority from Japanese Patent Application No. 2013-181523 filed on Sep. 2, 2013, the entire subject-matter of which is incorporated herein by reference.

BACKGROUND

1. Technical Field

The disclosure relates to a charged particle beam apparatus.

2. Description of the Related Art

An atom probe analysis method is an analysis method in which ions are field-evaporated from a surface of a sample such as a metal or a semiconductor, and the ions are identified by measuring time until the ions are incident on a predetermined mass spectrometer and a voltage at the time of the incidence. In the atom probe analysis method, individual atoms of the sample surface can be directly observed, and atom layers of the sample surface are observed for each layer so that a composition thereof can be identified.

Meanwhile, in analysis according to the atom probe analysis method, it is necessary to manufacture a needle-shaped sample in which a diameter of a tip end is about 100 nm. For this reason, a needle-shaped sample has been measured according to various methods in the related art. In recent years, a technique is known in which a needle-shaped sample is created from a thin film by using a focused ion beam (FIB) (for example, refer to JP-A-2009-294235).

In addition, in recent years, a technique is known in which a sample is irradiated with ion beams and electron beams in a perpendicular manner, and secondary charged particles generated by irradiation with the electron beams are detected while processing the sample into a needle shape with the ion beams, so that the sample can be processed into a needle shape while observing the sample in real time. In this case, for example, a liquid metal ion source is used as an ion source.

SUMMARY

In the above-described related art, ions may be implanted into a surface of the front end of the sample due to the irradiation with the ion beams, so that a damaged layer may be formed by the implanted ions.

Therefore, illustrative aspects of the present invention provide a charged particle beam apparatus which can prevent a damaged layer from being formed in a surface of a sample.

According to one illustrative aspect of the present invention, there may be provided a charged particle beam apparatus comprising: an electron beam irradiation unit configured to irradiate a sample with electron beams having a first irradiation axis; a rotation stage, which is configured to hold the sample, and which has a rotation axis in a direction perpendicular to the first irradiation axis; an ion beam irradiation unit configured to irradiate the sample with ion beams having a second irradiation axis that is substantially parallel to the rotation axis; a detection unit configured to detect at least one of charged particles and X rays generated via the sample by the irradiation with the ion beams and electron beams; and a gaseous ion beam irradiation unit configured to irradiate the sample with gaseous ion beams.

According to the illustrative aspect of the present invention, the gaseous ion beam irradiation unit irradiates the sample with the gaseous ion beams, and thus implanted ions which are implanted into the surface of the sample due to irradiation with the ion beams can be removed. In addition, in the present invention, since the sample can be rotated by the rotation stage, the implanted ions can be removed over the entire surface of the sample. Therefore, it is possible to prevent a damaged layer from being formed.

The charged particle beam apparatus may further comprise a control unit configured to control the charged beam apparatus to alternatively perform a rotation operation in which the rotation stage is rotated by a predetermined angle and an irradiation operation in which the gaseous ion beam irradiation unit applies the gaseous ion beams.

According to the illustrative aspect of the present invention, a rotation operation in which the rotation stage is rotated by a predetermined angle and an irradiation operation in which the gaseous ion beam irradiation unit applies the gaseous ion beams are alternately performed, and thus implanted ions can be efficiently removed from the sample.

In the charged particle beam apparatus, the detection unit may be configured to detect at least one of second electrons, secondary ions, backscattered electrons and transmitted electrons as the charged particles, the second electrons, secondary ions, backscattered electrons and transmitted electrons being generated from the sample, and the transmitted electrons being transmitted through the sample.

According to the illustrative aspect of the present invention, the detection unit can detect various kinds of charged particles as charged particles, and thus the sample can be observed in a multilateral manner.

In the charged particle beam apparatus, a semiconductor material may be used as the sample.

The fact is known that a sample containing a semiconductor material tends to be influenced by ion implantation due to irradiation with ion beams. According to the illustrative aspect of the present invention, it is possible to prevent a damaged layer from being formed due to implanted ions in the surface of the sample containing the semiconductor material, and thus a high quality sample can be manufactured.

In the charged particle beam apparatus, a liquid gallium ion source may be used as an ion source of the ion beam irradiation unit, and the semiconductor material may contain Si.

According to the illustrative aspect of the present invention, since a liquid gallium ion source is used as an ion source of the ion beam irradiation unit, Ga ions are implanted into a sample containing Si. In this case, characteristics of the semiconductor sample may vary due to a damaged layer of Ga ions. According to the present invention, it is possible to remove the implanted Ga ions, and thus to reduce influence on the semiconductor sample.

In the charged particle beam apparatus, the sample may have a tip end portion formed in a needle shape.

According to the illustrative aspect of the present invention, the gaseous ion beams are applied even to the sample whose tip end portion is formed in a needle shape, and thus implanted ions can be removed. Thus, a damaged layer is prevented from being formed at the tip end portion.

In the charged particle beam apparatus, the sample may be used for atom probe analysis.

According to the illustrative aspect of the present invention, even in the sample whose tip end portion is formed in a needle shape, a damaged layer is prevented from being formed at the tip end portion, and thus a needle-shaped sample having a diameter of a tip end portion of about 100 nm, used for atom probe analysis, can also be easily manufactured.

According to the illustrative aspects of the present invention, the sample can be rotated by the rotation stage, and implanted ions can be removed over the entire sample. Therefore, it is possible to prevent a damaged layer from being formed in a surface of the sample.

BRIEF DESCRIPTION OF THE DRAWINGS

FIGS. 4A to 4C are atom maps at the tip end portion Sa of a sample S, in which FIG. 4A is a diagram illustrating both kinds of atoms, FIG. 4B is a diagram illustrating silicon atoms, and FIG. 4C is a diagram illustrating gallium atoms;

FIGS. 6A to 6C are atom maps at the tip end portion Sa of the sample S, in which FIG. 6A is a diagram illustrating both kinds of atoms, FIG. 6B is a diagram illustrating silicon atoms, and FIG. 6C is a diagram illustrating gallium atoms.

DETAILED DESCRIPTION

Hereinafter, an illustrative embodiment of the present invention will be described.

Figure 1:
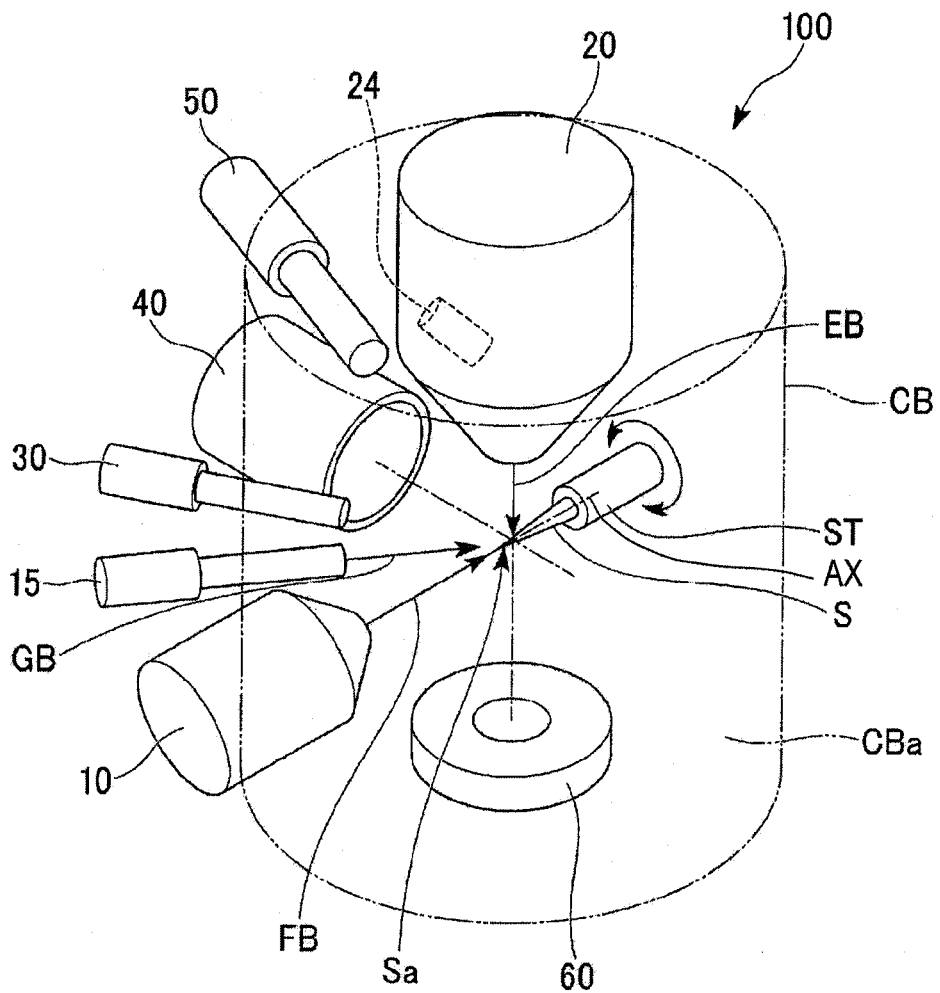
FIG. 1 is a schematic diagram illustrating a configuration of a charged particle beam apparatus 100 according to an illustrative embodiment.

FIG. 1 is a schematic diagram illustrating a configuration of a charged particle beam apparatus 100 according to the present illustrative embodiment.

The charged particle beam apparatus 100 illustrated in FIG. 1 manufactures a needle-shaped sample S used for an atom probe analysis method. As a material forming the sample S, for example, a metal or a semiconductor is used. The sample S is sharpened by the charged particle beam apparatus 100 so that a diameter of a tip end portion Sa is about 100 nm.

As illustrated in FIG. 1, the charged particle beam apparatus 100 includes an ion beam irradiation unit 10 which applies focused ion beams FB, a gaseous ion beam irradiation unit 15 which applies gaseous ion beams GB, an electron beam irradiation unit 20 which applies electron beams EB, a secondary charged particle detection unit 30, an EBSD detection unit 40, an EDS detection unit 50, a STEM detection unit 60, a sample stage ST which holds the sample S, a vacuum chamber CB, a control unit CR, and a display unit DP.

In the charged particle beam apparatus 100, some or all of the ion beam irradiation unit 10, the gaseous ion beam irradiation unit 15, the electron beam irradiation unit 20, the secondary charged particle detection unit 30, the EBSD detection unit 40, the EDS detection unit 50, the STEM detection unit 60, and the sample stage ST are disposed inside the vacuum chamber CB. A vacuum pump (not illustrated) is provided in the vacuum chamber CB, and thus the inside CBa thereof can be exhausted up to a high vacuum atmosphere.

Figure 2:
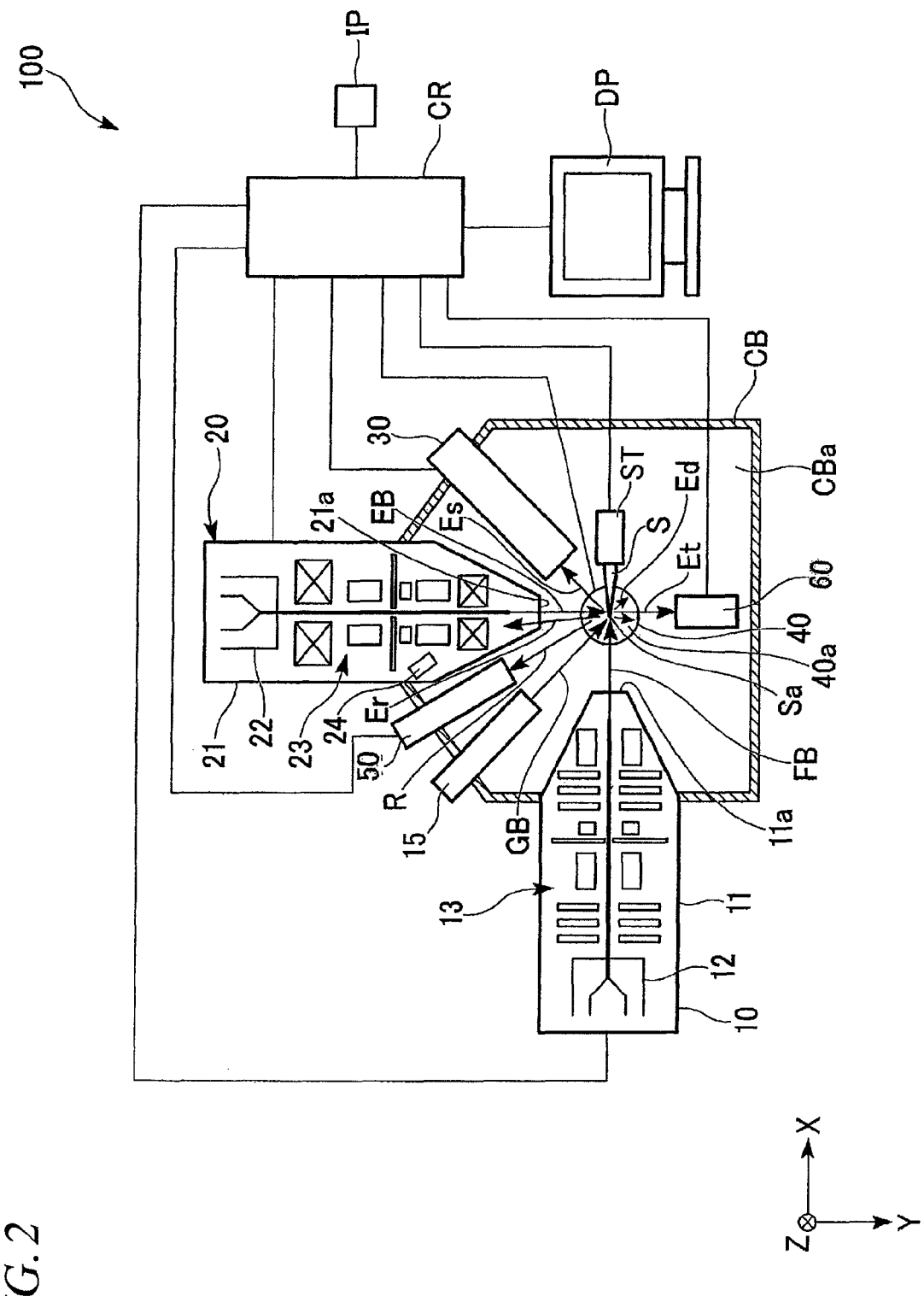
FIG. 2 is a schematic cross-sectional view of the charged particle beam apparatus 100.

FIG. 2 is a schematic cross-sectional view of the charged particle beam apparatus 100. FIG. 2 illustrates only cross-sectional configurations of the ion beam irradiation unit 10, the electron beam irradiation unit 20, and the vacuum chamber CB, and schematically illustrates the other configurations. In addition, in FIG. 2, directions in the figure are described by using an XYZ coordinate system. In the XYZ coordinate system, an irradiation direction of the focused ion beams FB which are applied from the ion beam irradiation unit 10 is set to an X direction, an irradiation direction of the electron beams EB which are applied from the electron beam irradiation unit 20 is set to a Y direction, and a direction perpendicular to the X direction and the Y direction is set to a Z direction. It will be described that, in each of the X direction, the Y direction, and the Z direction, the arrow direction in the figure is a positive direction, and a direction opposite to the arrow direction is a negative direction. In addition, a direction around the X axis is indicated by a θX direction.

As illustrated in FIG. 2, the ion beam irradiation unit 10 includes an ion beam column 11, an ion beam generation source 12, and an ion beam optical system 13. The ion beam column 11 is formed in a cylindrical shape, and a central axis thereof is disposed in parallel to the X direction. For example, a liquid gallium ion source may be used as the ion beam generation source 12. The ion beam generation source 12 and the ion beam optical system 13 are disposed inside the ion beam column 11. The ion beam irradiation unit 10 has a configuration in which ion beams generated by the ion beam generation source 12 are thinned by the ion beam optical system 13 so as to be formed as focused ion beams FB, and the focused ion beams FB are emitted in the +X direction from an emission port 11a which is disposed at an +X side end part of the ion beam column 11. As mentioned above, an irradiation axis of the focused ion beams FB which are applied from the ion beam irradiation unit 10 is parallel to the X axis.

The gaseous ion beam irradiation unit 15 applies gaseous ion beams GB such as argon ion beams. An irradiation angle of the gaseous ion beams GB by the gaseous ion beam irradiation unit 15 is not particularly limited. The gaseous ion beams GB are focused to a lower degree than the focused ion beams FB, and thus an etching rate thereof in a sample surface is also low.

The electron beam irradiation unit 20 includes an electron beam column 21, an electron beam generation source 22, and an electron beam optical system 23. The electron beam column 21 is formed in a cylindrical shape, and a central axis thereof is disposed in parallel to the Y direction. The electron beam generation source 22 and the electron beam optical system 23 are disposed inside the electron beam column 21. The electron beam irradiation unit 20 has a configuration in which electron beams generated by the electron beam generation source 22 are thinned by the electron beam optical system 23 so as to be formed as electron beams EB, and the electron beams EB are emitted in the +Y direction from an emission port 21a which is disposed at a +Y side end part of the electron beam column 21. As mentioned above, an irradiation axis of the electron beams EB applied by the electron beam irradiation unit 20 is parallel to the Y axis. As described above, an irradiation axis of the electron beams EB is perpendicular to the irradiation axis of the focused ion beams FB. In addition, a secondary electron detection unit 24 detecting reflected electrons Er which are generated at the tip end portion Sa of the sample S and reach the inside of the electron beam column 21 is provided inside the electron beam column 21.

As mentioned above, the ion beam irradiation unit 10 and the electron beam irradiation unit 20 are disposed so that the focused ion beams FB and electron beams EB are applied in directions perpendicular to each other. The sample stage ST holds the sample S so that the tip end portion Sa of the sample S is disposed at or near a position where the focused ion beams FB intersect the electron beams EB.

In the present illustrative embodiment, the sample stage ST holds the sample S so that the tip end portion Sa of the sample S faces in the −X direction. For this reason, the focused ion beams FB are applied to the tip end portion Sa from the tip end side of the sample S. In addition, since the electron beams EB are applied in the direction perpendicular to the focused ion beams FB, the electron beams EB can be applied to the tip end portion Sa which is irradiated with the focused ion beams FB. For this reason, it is possible to observe the tip end portion Sa which is currently being processed by the focused ion beams FB. Further, the sample stage ST is provided so as to rotate about a rotation axis AX which is parallel to the X axis.

The ion beam irradiation unit 10 can change an irradiation position of the focused ion beams FB with respect to the tip end portion Sa of the sample S.

When the tip end portion Sa of the sample S is irradiated with the focused ion beams FB or the electron beams EB, charged particles such as secondary electrons Es, backscattered electrons Ed, or secondary ions are generated at the tip end portion Sa. In addition, X rays R are emitted from the tip end portion Sa. Further, transmitted electrons Et which are transmitted through the tip end portion Sa are also generated. The secondary charged particle detection unit 30 detects the secondary electrons Es or the secondary ions generated at the tip end portion Sa of the sample S. The secondary charged particle detection unit 30 detects electrons which have angles different from those of electrons detected by the secondary electron detection unit 24, among the secondary electrons Es. An uneven shape or the like of the tip end portion Sa can be observed by using a result detected by the secondary charged particle detection unit 30.

The EBSD detection unit 40 detects the backscattered electrons Ed generated at the tip end portion Sa of the sample S. The EBSD detection unit 40 performs detection based on a principle of an electron beam backscatter diffraction method. The electron beam backscatter diffraction method is a method of analyzing a diffraction pattern of the backscattered electrons generated by irradiation with the electron beams EB. If a crystalline sample is irradiated with electron beams, the backscattered electrons are generated as described above. The backscattered electrons are diffracted by crystal lattice surfaces of the sample. The diffracted backscattered electrons (diffracted electrons) form a strip-shaped diffraction pattern on a predetermined surface. A crystal structure or a crystal orientation can be obtained by detecting the diffraction pattern.

The EBSD detection unit 40 has a detection surface 40a on which a diffraction pattern is formed. The EBSD detection unit 40 can detect a diffraction pattern of backscattered electrons, formed on the detection surface 40a. The detection surface 40a has a planar shape, and faces in the −Z side direction. The detection surface 40a is circular when viewed in the Z direction. The detection surface 40a is disposed in the +Z direction when viewed from the tip end portion Sa of the sample S.

The EDS detection unit 50 detects the X rays R generated at the tip end portion Sa of the sample S. The X rays R are characteristic X rays which are different for each element. The EDS detection unit 50 can detect such characteristic X rays and thus can detect an element contained in the tip end portion Sa. In addition, the EDS detection unit 50 has low dependency on an orientation of a detection result, and thus the detection surface may face toward the sample S side. By using the EDS detection unit 50, a processing state can be observed when interfaces having different compositions are processed in the tip end portion Sa.

The STEM detection unit 60 detects the transmitted electrons Et which are transmitted through the tip end portion Sa of the sample S. The STEM detection unit 60 can detect a crystal state, composition information, or the like of the tip end portion Sa. In addition, the control unit CR can obtain three-dimensional information of the tip end portion Sa on the basis of a detection result from the STEM detection unit 60. In a stage in which the tip end portion Sa is not sufficiently processed, since a diameter of the tip end portion Sa is large, the transmitted electrons Et are few, and detection accuracy is not high. On the other hand, if processing of the tip end portion Sa progresses, since a diameter of the tip end portion Sa is reduced (about 100 nm), transmitted electrons Et increase, and thus detection accuracy increases. Therefore, the present illustrative embodiment is suitably used (for example, in a final step) after the step of the tip end portion Sa being currently processed.

The control unit CR collectively controls the above-described constituent elements, and changes an acceleration voltage or a beam current of the ion beam column 11 of the ion beam irradiation unit 10 and the electron beam column 21 of the electron beam irradiation unit 20. The control unit CR changes an acceleration voltage or a beam amount of the ion beam irradiation unit 10 so that a beam diameter of the focused ion beams FB can be freely adjusted. Thus, an observation image can not only be acquired, but the sample S can also be locally etched. In addition, when etching processing is performed, a beam diameter is adjusted, and thus processing accuracy can be freely varied from rough processing to finish processing.

The control unit CR can adjust an irradiation time, an irradiation timing, irradiation energy, and the like of the gaseous ion beams GB which are applied from the gaseous ion beam irradiation unit 15. The control unit CR can adjust a position, a rotation angle, a rotation timing, a rotation speed, a rotation direction, and the like in the XYZ directions of the sample stage ST.

The control unit CR can generate observation image data by converting detection results detected by the respective units including the secondary electron detection unit 24, the secondary charged particle detection unit 30, the EBSD detection unit 40, the EDS detection unit 50, and the STEM detection unit 60, into signals. The control unit CR generates the observation image data, and then can output an observation image to the display unit DP on the basis of the observation image data.

The control unit CR is connected to an input unit IP which allows an operator to input information. The control unit CR can control each constituent element on the basis of a signal which is input via the input unit IP. For example, the operator can adjust irradiation positions or beam diameters of the focused ion beams FB and electron beams EB via the input unit IP. In this case, the operator can perform etching processing by irradiating a desired region of the tip end portion Sa with the focused ion beams FB, or can perform observation by irradiating the desired region with the electron beams EB. In addition, the operator can perform irradiation with the gaseous ion beams GB via the input unit IP.

Next, a description will be made of a sample creation method of processing the sample S into a needle shape by using the charged particle beam apparatus 100 having this configuration. First, an initial setting is performed in which the sample S is held on the sample stage ST and the vacuum chamber CB is set to a vacuum state. After the initial setting is completed, steps are performed in which the sample S is irradiated with the focused ion beams FB so as to process the tip end portion Sa of the sample S into a needle shape.

The control unit CR operates the sample stage ST so as to adjust a position of the tip end portion Sa of the sample S. Then, the control unit CR causes the ion beam irradiation unit 10 to irradiate the sample S with the focused ion beams FB.

Figure 3:
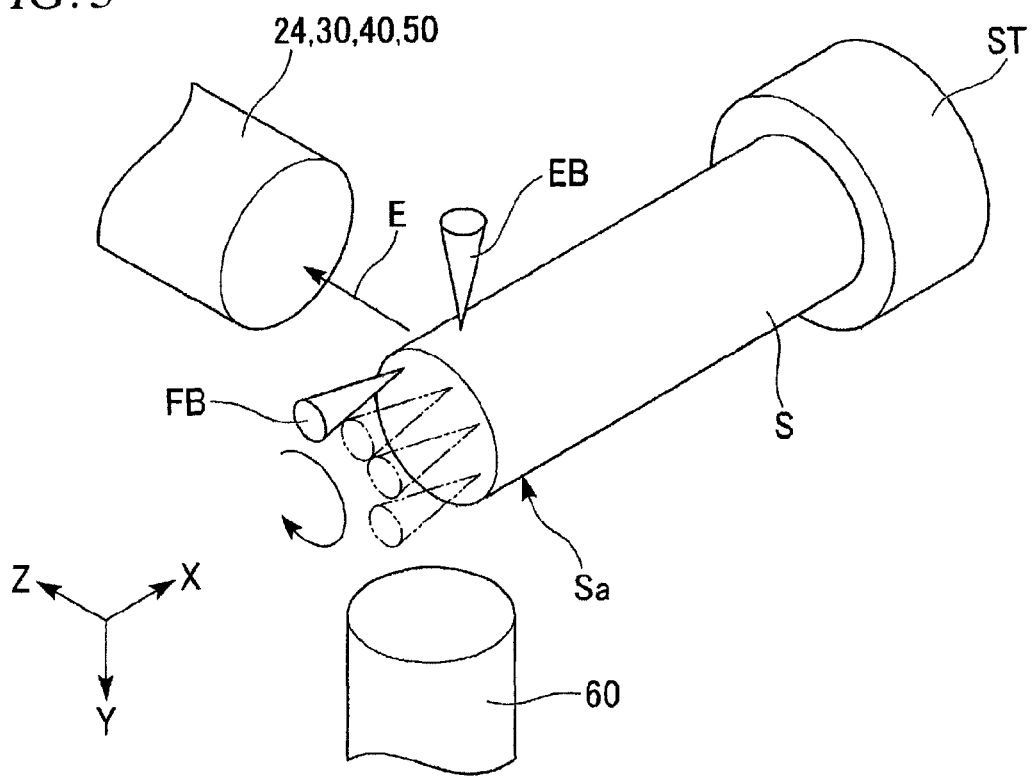
FIG. 3 is a diagram illustrating a state in which a tip end portion Sa is processed by an ion beam irradiation unit 10.

FIG. 3 is a diagram illustrating a state in which the tip end portion Sa is processed by the ion beam irradiation unit 10.

As illustrated in FIG. 3, the ion beam irradiation unit 10 irradiates the tip end portion Sa with the focused ion beams FB in the +X direction. At this time, the focused ion beams FB are applied to a position deviated from a central part of the tip end portion Sa when viewed from the X direction. A part of the tip end portion Sa which is irradiated with the focused ion beams FB is selectively etched by the focused ion beams FB.

After the part of the tip end portion Sa is irradiated with the focused ion beams FB, the control unit CR deviates an irradiation position of the focused ion beams FB in the θX direction so as to apply the focused ion beams FB thereto. As mentioned above, the etching is performed while deviating an irradiation region of the focused ion beams FB in the θX direction. This process is repeatedly performed, and thus the tip end portion Sa of the sample S is gradually sharpened so as to be formed into a needle shape.

A rotation angle of the sample S, or a beam diameter, an irradiation time, or the like of the focused ion beams FB may be set by the operator, and may be set to a predetermined value in advance and the predetermined value may be used. In a case where the predetermined value is set, the predetermined value may be changed.

During processing of the sample S, in a case where it is desired to check an observation image, the electron beam irradiation unit 20 may be made to apply the electron beams EB as appropriate. FIG. 3 illustrates a state in which charged particles E generated by the electron beams EB are detected by the various detection units (the secondary electron detection unit 24, the secondary charged particle detection unit 30, the EBSD detection unit 40, the EDS detection unit 50, and the STEM detection unit 60).

The control unit CR generates observation image data based on detection results from the respective detection units, and displays an observation image on the display unit DP. The operator can observe a state of the tip end portion Sa of the sample S from the observation image displayed on the display unit DP. The operator can select an observation image of a detection unit which is displayed on the display unit DP.

In the present illustrative embodiment, the irradiation axis of the focused ion beams FB is parallel to the rotation axis AX of the sample stage ST, and thus a rotational center of the sample stage ST can be observed (SIM observation). On the basis of the observation result, the control unit CR or the operator disposes the sample S on the rotation axis of the sample stage ST (a center position calculation function). Therefore, an axis deviation can be prevented, and thus the sample S can be processed and observed during rotation of the sample S. In addition, a processing end position can be detected by alternately performing processing and observation.

Figure 4A:
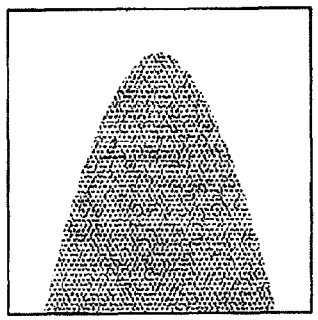
Figure 4B:
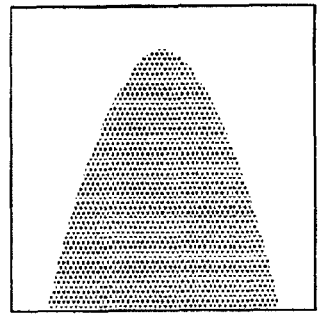
Figure 4C:
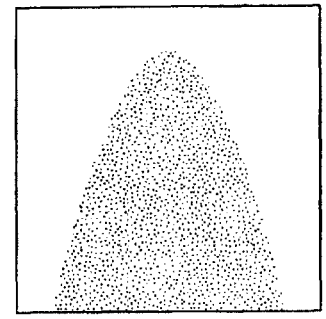

After the tip end portion Sa of the sample S is formed into a needle shape, a final finish is performed. Due to the irradiation with the focused ion beams FB, gallium ions are implanted into the surface of the tip end portion Sa. FIGS. 4A, 4B and 4C are atom maps illustrating a state of the tip end portion Sa of the sample S. Si is used as the sample S, and thus the atom maps illustrated in FIGS. 4A to 4C are obtained by observing a state of a tip end of Si. FIG. 4A is a diagram illustrating both kinds of atoms, FIG. 4B is a diagram illustrating silicon atoms, and FIG. 4C is a diagram illustrating gallium atoms. As illustrated in FIGS. 4A to 4C, especially in FIG. 4C, a plurality of gallium atoms (gallium ions) are implanted into the surface of the tip end portion Sa. A damaged layer is formed in the surface of the tip end portion Sa by the gallium atoms (gallium ions). In the final finish, the gallium atoms (gallium ions) implanted into the surface of the tip end portion Sa are removed.

Figure 5:
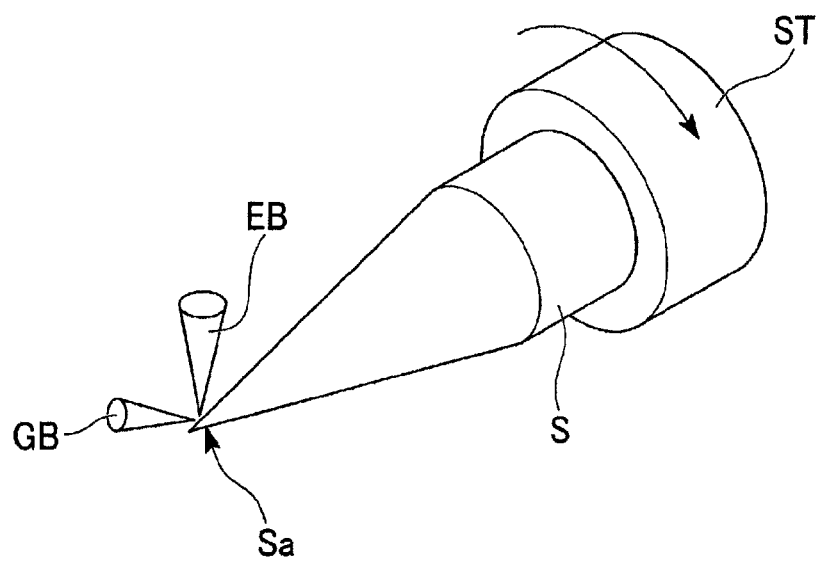
FIG. 5 is a diagram illustrating a state in which the tip end portion Sa is finally finished by a gaseous ion beam irradiation unit 15.
Figure 5:
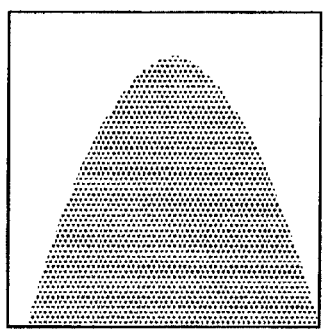
Figure 5:
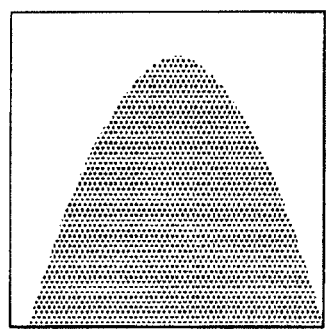
Figure 5:
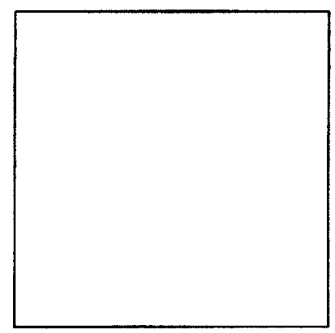

FIG. 5 is a perspective view illustrating a state in which the gallium ions implanted into the surface of the tip end portion Sa are removed.

As illustrated in FIG. 5, in a case of removing the gallium ions, the gaseous ion beam irradiation unit 15 irradiates the tip end portion Sa with the gaseous ion beams GB. Since the gaseous ion beams GB have an etching rate lower than that of the focused ion beams FB, only the surface of the tip end portion Sa is etched without changing the shape of the tip end portion Sa. Thus, the gallium atoms (gallium ions) implanted into the surface of the tip end portion Sa are removed through the etching.

FIGS. 6A, 6B and 6C are atom maps illustrating a state of the tip end portion Sa of the sample S. FIG. 6A is a diagram illustrating both kinds of atoms, FIG. 6B is a diagram illustrating silicon atoms, and FIG. 6C is a diagram illustrating gallium atoms. As illustrated in FIGS. 6A to 6C, especially, in FIG. 6C, the gallium atoms (gallium ions) are not present in the surface of the tip end portion Sa. As mentioned above, the gallium atoms (gallium ions) implanted into the surface of the tip end portion Sa are removed through the final finish.

In this final finish step, the control unit CR causes an irradiation operation of the gaseous ion beams GB and a rotation operation in which the sample stage ST is rotated by a predetermined angle in the θX direction, to be alternately performed. For example, the gaseous ion beams GB are applied once, and then the sample stage ST is incrementally rotated in the θX direction by 30°. The sample stage ST is rotated, and then the gaseous ion beams GB are applied once.

As mentioned above, whenever the gaseous ion beams GB are applied once, the sample stage ST is rotated by 30° in the θX direction. If this operation is repeatedly performed, and the sample stage ST is incrementally rotated in the θX direction by 360°, the final finish step is completed. At this time, if a time from start of the final finish step to end thereof is set in advance, a time period of each irradiation operation of the gaseous ion beams GB and a time period of each rotation operation of the sample stage ST are automatically set so as to be uniform at each number of times. As mentioned above, by adjusting a rotation angle, a time of a rotation operation, and an irradiation time of the gaseous ion beams GB, it is possible to uniformly clean the entire tip end portion Sa in the circumferential direction. As illustrated in FIG. 5, when the final finish step is performed, the electron beam irradiation unit 20 may apply the electron beams EB, and a state of the tip end portion Sa may be observed in the various detection units.

As mentioned above, in the present illustrative embodiment, the gaseous ion beam irradiation unit 15 irradiates the sample S with the gaseous ion beams GB, and thus the gallium ions implanted into the surface of the sample S due to the irradiation with the focused ion beams FB can be removed. Furthermore, in the present illustrative embodiment, the sample S can be rotated by the sample stage ST, and thus the gallium ions can be removed over the entire surface of the sample S. Therefore, it is possible to prevent a damaged layer from being formed in the surface of the sample S.

In the present illustrative embodiment, a rotation operation in which the sample stage ST is rotated by a predetermined angle and an irradiation operation in which the gaseous ion beam irradiation unit 15 applies the gaseous ion beams GB are alternately performed, and thus gallium ions can be efficiently removed from the sample S. In addition, the rotation operation and the irradiation operation may be performed not alternately but simultaneously.

In the present illustrative embodiment, since at least one of secondary electrons, secondary ions, backscattered electrons generated at the sample, and transmitted electrons which are transmitted through the sample S can be detected, and X rays can also be detected, the sample S can be observed in a multilateral manner.

In the present illustrative embodiment, although a semiconductor material such as Si has been described as a material of the sample S, the sample S containing such a semiconductor material tends to be influenced by ion implantation due to irradiation with ion beams. According to the present illustrative embodiment, it is possible to prevent a damaged layer from being formed due to ions in the surface of the sample S containing the semiconductor material, and thus the high quality sample S can be manufactured.

Since a liquid gallium ion source is used as an ion source of the ion beam irradiation unit 10, even if gallium ions are implanted into a sample containing Si, the implanted gallium ions can be removed. Consequently, it is possible to prevent a damaged layer from being formed due to the gallium ions, and thus it is possible to minimize variations in characteristics of the sample S.

Particularly, since processing using the focused ion beams FB is performed after matching with a rotation center of the sample stage ST is made, a damaged layer is uniformly formed. In addition, since the entire tip end portion Sa in the circumferential direction can be uniformly cleaned by the gaseous ion beams GB, it is possible to manufacture a high quality sample in which a damaged layer is minimized even at a fine tip end.

In the present illustrative embodiment, the gaseous ion beams GB are applied even to the sample S whose tip end portion Sa is formed in a needle shape, and thus gallium ions can be removed from the surface thereof. Thus, even in the sample S whose tip end portion Sa is formed in a needle shape, a damaged layer is prevented from being formed at the tip end portion Sa. For this reason, a needle-shaped sample having a diameter of a tip end of about 100 nm, used for atom probe analysis, can also be easily manufactured.

The technical scope of the present invention is not limited to the above-described illustrative embodiment, and may be modified within the scope without departing from the spirit of the present invention as appropriate.

For example, in the above-described illustrative embodiment, argon has been described as an example of a gas constituting the gaseous ion beams GB, but the present invention is not limited thereto. For example, as such a gas, not only argon but also a rare gas such as neon or xenon or an inert gas such as nitrogen may be used.

What is claimed is:

1. A charged particle beam apparatus comprising:
   an electron beam irradiation unit configured to irradiate a sample with electron beams along a first irradiation axis;
   a rotation stage, which is configured to hold the sample, and which has a rotation axis in a direction perpendicular to the first irradiation axis;
   an ion beam irradiation unit configured to irradiate the sample with ion beams along a second irradiation axis that is substantially parallel to the rotation axis so as to process the sample into a needle shape;
   a detection unit configured to detect at least one of charged particles and X rays generated via the needle-shaped sample by the irradiation with the ion beams or the electron beams;
   a gaseous ion beam irradiation unit configured to irradiate the needle-shaped sample with gaseous ion beams; and
   a control unit configured to control the charged particle beam apparatus to perform:
      a rotation operation in which the rotation stage is rotated by a predetermined angle repeatedly so as to rotate the sample stage by 360°; and
      an irradiation operation in which the gaseous ion beam irradiation unit irradiates an entire surface of the needle-shaped sample in a circumferential direction with the gaseous ion beams.

2. The charged particle beam apparatus according to claim 1, wherein the control unit is configured to control the charged beam apparatus to alternatively perform the rotation operation and the irradiation operation.

3. The charged particle beam apparatus according to claim 1, wherein the detection unit is configured to detect at least one of secondary electrons, secondary ions, backscattered electrons and transmitted electrons as the charged particles, the secondary electrons, secondary ions, backscattered electrons and transmitted electrons being generated from the sample, and the transmitted electrons being transmitted through the sample.

4. The charged particle beam apparatus according to claim 1, wherein the sample is composed of a semiconductor material.

5. The charged particle beam apparatus according to claim 4,
   wherein a liquid gallium ion source is used as an ion source of the ion beam irradiation unit, and
   wherein the semiconductor material contains Si.

6. The charged particle beam apparatus according to claim 1, wherein the ion beam irradiation unit processes a tip end portion of the sample into a needle shape.

7. The charged particle beam apparatus according to claim 1, wherein the control unit is configured to control the charged particle beam apparatus to process the sample into a needle shape suitable for use in atom probe analysis.

8. The charged particle beam apparatus according to claim 1, wherein the control unit is configured to control the charged beam apparatus to perform an electron beam irradiation operation in which the electron beam irradiation unit irradiates the needle-shaped sample with the electron beams.

9. A charged particle beam apparatus comprising:
   a rotation stage rotatable about a rotation axis and configured to hold a sample;
   an ion beam irradiation unit configured to irradiate the sample with ion beams directed along an irradiation axis that is substantially parallel to the rotation axis to process a tip end portion of the sample into a needle shape while, at the same time, implanting ions into the surface of the sample;
   a gaseous ion beam irradiation unit configured to irradiate the tip end portion of the sample with gaseous ion beams to remove implanted ions from the sample surface; and
   a control unit configured to control the charged particle beam apparatus to perform:
      a rotation operation in which the rotation stage is repeatedly incrementally rotated in the same direction 360°; and
      an irradiation operation in which the gaseous ion beam irradiation unit irradiates the entire surface of the tip end portion of the sample with the gaseous ion beams in conjunction with the incremental rotation of the rotation stage to remove implanted ions from the tip end portion.

10. The charged particle beam apparatus according to claim 9; wherein the control unit is configured to alternately perform the rotation operation and the irradiation operation.

11. The charged particle beam apparatus according to claim 9; wherein the control unit is configured to simultaneously perform the rotation operation and the irradiation operation.

12. The charged particle beam apparatus according to claim 9; wherein the control unit is configured to perform an irradiation operation in which the ion beam irradiation unit repeatedly irradiates the tip end portion of the sample with the ion beams at different circumferentially spaced irradiation positions to sharpen the tip end portion.

13. The charged particle beam apparatus according to claim 9; wherein the sample is composed of semiconductor material.

14. The charged particle beam apparatus according to claim 13; wherein the ion beam irradiation unit includes a liquid gallium ion source that produces gallium ion beams, and the semiconductor material of the sample contains silicon.

15. The charged particle beam apparatus according to claim 9, wherein the control unit is configured to control the charged particle beam apparatus to process the sample into a needle shape suitable for use in atom probe analysis.

\* \* \* \* \*